United States Patent [19]

Jarrett et al.

[11] Patent Number: 4,542,303
[45] Date of Patent: Sep. 17, 1985

[54] COMPARATOR CIRCUIT

[75] Inventors: Robert B. Jarrett, Tempe; Robert A. Neidorff, Chandler, both of Ariz.

[73] Assignee: Motorola, Inc., Schaumburg, Ill.

[21] Appl. No.: 538,619

[22] Filed: Oct. 3, 1983

[51] Int. Cl.⁴ .......................................... H03K 5/153
[52] U.S. Cl. ................................... 307/350; 307/354; 307/362
[58] Field of Search ............... 307/350, 362, 363, 354, 307/290

[56] References Cited

U.S. PATENT DOCUMENTS 4,115,711  9/1978  Moussie ............................... 307/350

Primary Examiner—John Zazworsky
Attorney, Agent, or Firm—Vincent B. Ingrassia

[57] ABSTRACT

This relates to a comparator circuit for monitoring intelligence on a data bus, which circuit consumes no power until activated by a predetermined voltage on the data bus. An input PNP transistor has a base coupled to the data bus. An emitter resistor and a collector resistor may be scaled to achieve a desired switching threshold. A second PNP transistor has a base coupled to the bus and an emitter coupled to the collector of the first PNP transistor such that the second PNP transistor does not turn on until the first PNP transistor saturates. The collector of the second PNP transistor is coupled to the base of an output NPN transistor and supplies drive thereto when the second PNP transistor is on.

4 Claims, 2 Drawing Figures

COMPARATOR CIRCUIT

BACKGROUND OF THE INVENTION

This invention relates generally to a comparator circuit and, more particularly, to a comparator circuit which draws no supply current unless a voltage of a predetermined magnitude appears at an appropriate one of its inputs.

It is well-known that automobile manufacturers are tending towards the use of a multiplexed wiring scheme as opposed to the more traditional discrete wiring arrangement. This not only reduces the amount of wiring and connections necessary, but also reduces the labor of troubleshooting and improves long term reliability.

In addition, the automobile industry recognizes the need for diagnostic; i.e., the ability of an onboard computer to sense when, for example, a lamp is burned out or shorted, which lamp is burned out, and immediately inform the driver of the vehicle. Therefore, the multiplexed wiring system must include circuits which are capable of sensing intelligence at each element (e.g. lamp) and distributing this intelligence.

It is well-known that comparator circuits may be utilized to sense data on a data bus. The comparator trips when the voltage on the data bus reaches a predetermined threshold. Typical comparator circuits include a differential pair of transistors, the first of which has a control electrode coupled to a voltage divider circuit which sets the threshold voltage. The second transistor has a control electrode coupled to the voltage to be sensed. Unfortunately, this known circuit always draws supply current into the divider and into the differential pair. This is unsuitable for automotive purposes since, such a circuit would load down the battery even when the ignition key is off.

SUMMARY OF THE INVENTION

It is an object of the present invention to provide an improved comparator circuit.

It is a further object of the present invention to provide a comparator circuit for sensing intelligence on a multiplexed wiring scheme in an automotive control system.

It is a still further object of the present invention to provide a comparator circuit which monitors a data bus for intelligence without drawing battery current until intelligence is detected.

It is a still further object of the present invention to provide an improved comparator circuit which is fast, consumes little power, is versatile and is inexpensive.

According to a broad aspect of the invention there is provided a comparator circuit for detecting when an input signal reaches a predetermined threshold, comprising input transistor means having base, emitter and collector terminals, the base terminal being coupled to monitor an input signal. Impedance means is coupled to the emitter and collector terminals of the input transistor for selectively varying the threshold. Switching transistor means has base, emitter and collector terminals, the base being coupled to the input signal and the emitter being coupled to the collector of the input transistor means, the switching transistor turning on when the input transistor means saturates. An output circuit means is coupled to the collector of the switching transistor means and is responsive thereto.

The above and other objects, features and advantages of the present invention will be more clearly understood from the following detailed description taken in conjunction with the accompanying drawings, in which:

DESCRIPTION OF THE PREFERRED EMBODIMENT

Figure 1:
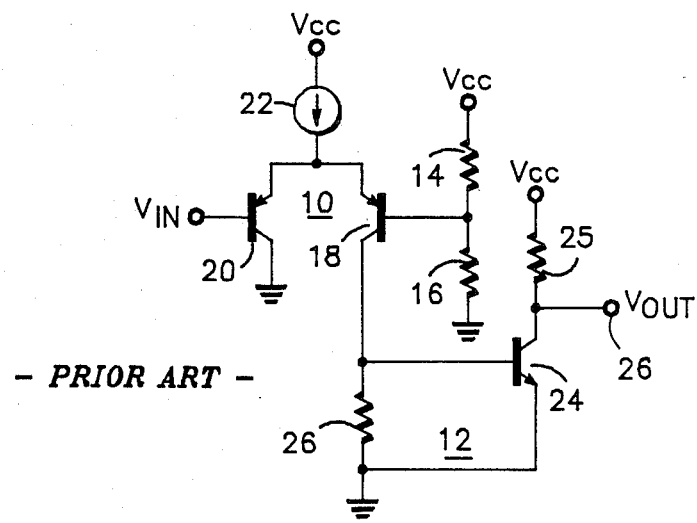
FIG. 1 is a schematic diagram of a well-known comparator circuit in accordance with the prior art.

FIG. 1 is a schematic diagram of a typical comparator circuit having a differential transistor stage generally denoted 10 and an output stage generally denoted 12. First and second resistors 14 and 16 are coupled as a voltage divider between first and second sources of supply voltage (in this case $V_{CC}$ and ground) to establish a threshold voltage at the base of transistor 18. An unknown input voltage ($V_{IN}$) which is being monitored by the comparator circuit is coupled to the base of transistor 20. Transistors 18 and 20 are shown as PNP transistors having their emitters coupled together and to $V_{CC}$ via current source 22. The collector of transistor 20 is coupled to ground whereas the collector of transistor 18 is coupled to the base of NPN output transistor 24 and to ground via resistor 26. The emitter of transistor 24 is coupled to ground while its collector is coupled to $V_{CC}$ through a resistor 25 and to output terminal 26.

The circuit shown in FIG. 1 operates in a well-known matter. That is, when the input voltage $V_{IN}$ falls below the threshold voltage appearing at the base of transistor 18, more of the current being supplied by current source 22 will flow through transistor 20 and less will flow through transistor 18 shutting transistor 18 off. With transistor 18 off, no base drive is supplied to the base of transistor 24 maintaining it also off. With transistor 24 off, the voltage appearing at output terminal 26 will be high.

If on the other hand, input voltage $V_{IN}$ were to rise above the threshold voltage appearing at the base of transistor 18, transistor 18 would remain on and supply base drive to the base of transistor 24 turning it on. With transistor 24 on, the voltage appearing at output terminal 26 would fall.

Unfortunately, the circuit shown in FIG. 1 suffers from the disadvantages previously described. That is, the circuit always consumes power (i.e., draws supply current) in both the divider pair (resistors 14 and 16) and in the differential pair (transistors 18 and 20).

Figure 2:
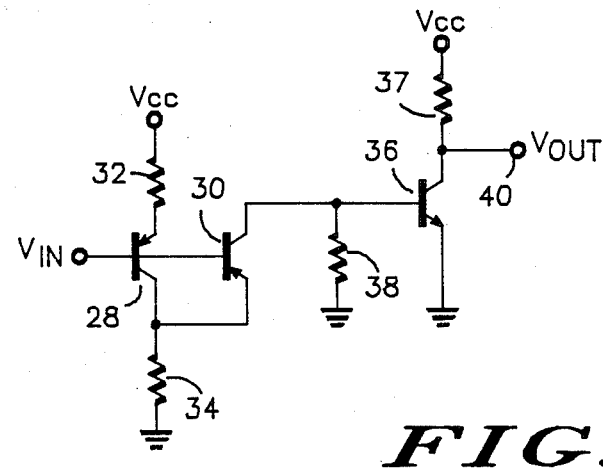
FIG. 2 is a schematic diagram of the inventive comparator circuit.

The circuit shown in FIG. 2 solves the problems associated with the FIG. 1 comparator circuit. The unknown input voltage to be monitored ($V_{IN}$) is coupled to the base of PNP input transistor 28 and to the base of PNP switching transistor 30. The emitter of transistor 28 is coupled via resistor 32 to $V_{CC}$ while its collector is coupled to ground via resistor 34. The collector of transistor 28 is also coupled to the emitter of transistor 30.

The collector of transistor 30 is coupled to the base of NPN output transistor 36 and to ground via resistor 38. Output transistor 36 has an emitter coupled to ground and a collector coupled to $V_{CC}$ through a resistor 37 and to output terminal 40 at which the voltage ($V_{OUT}$) appears.

This circuit operates as follows. The circuit's threshold voltage which is the voltage at which transistor 28 saturates corresponds to a fraction of the supply voltage and may be set by properly scaling resistors 32 and 34. For purposes of discussion, assume that the threshold voltage corresponds to one-half the supply voltage $V_{CC}$.

If we first assume that the input voltage $V_{IN}$ equals $V_{CC}$, it should be clear that both transistors 28 and 30 remain off. With transistors 28 and 30 off, no base drive is supplied to the base of transistor 36 maintaining it also off. Thus, there is no voltage drop on any of the resistors in the circuit and therefore no power consumption. If, for example, the ignition were turned on and $V_{IN}$ were to drop to a desired threshold (e.g. $V_{CC}/2$), transistor 28 would begin to slowly turn on as the input voltage $V_{IN}$ dropped. When $V_{IN}$ reaches $V_{CC}/2$, transistor 28 will be on the edge of saturation. As $V_{IN}$ falls slightly further, transistor 28 will saturate. When transistor 28 saturates, the collector-base junction of transistor 28 is forward biased (e.g., turned on). Therefore, the collector-base junction of transistor 30 must be forward biased meaning that transistor 30 must also be on. Stated differently, the junction which makes up the emitter base junction of transistor 30 is in parallel with the base-collector junction of transistor 28. Thus, when the base-collector junction of transistor 28 is on, the emitter base junction of transistor 30 must also be on.

When transistor 30 turns on, base drive is supplied to the base of transistor 36 via the collector of transistor 30 turns transistor 36 on. When transistor 36 turns on, the voltage appearing at output terminal 40 will fall.

It is interesting to note that that if the circuit were to be implemented in integrated circuit form, transistors 28 and 30 could be constructed in the same epitaxial region. Further, transistor 30 could be structurally implemented as a P-ring around transistor 28.

As stated previously, the input voltage must fall slightly below $V_{CC}/2$ before the comparator will trip. If, for example, it were desired to have a zero temperature coefficient comparator which trips at exactly one-half the supply voltage, it would be necessary to place two diodes in series with resistor 34 and make the resistance of resistor 34 equal to that of resistor 32.

The above description is given by way of example only. Changes in form and details may be made by one skilled in the art without departing from the scope of the invention as defined by the appended claims.

We claim:

1. A comparator circuit for detecting when an input signal reaches a predetermined threshold, comprising:
 input transistor means having base, emitter and collector terminals, said base terminal being coupled to monitor an input signal;
 impedance means coupled to the emitter and collector terminals of said input transistor means for selectively varying said threshold;
 switching transistor means having base, emitter and collector terminals, said base terminal coupled to said input signal and said emitter terminal coupled to the collector terminal of said input transistor means, said switching transistor means turning on when said input transistor means saturates; and
 output circuit means coupled to the collector terminal of said switching transistor means and responsive thereto.

2. A comparator circuit according to claim 1 wherein said input transistor means comprises a PNP transistor and wherein said impedance means comprises a first resistor coupled between the emitter terminal of said first PNP transistor and a first source of supply voltage and a second resistor coupled between the collector terminal of said input transistor means and a second source of supply voltage.

3. A comparator circuit according to claim 2 wherein said switching transistor means comprises a second PNP transistor.

4. A comparator circuit according to claim 3 wherein said output circuit means comprises an NPN transistor having a base coupled to the collector terminal of said second PNP transistor, an emitter coupled to ground and a collector coupled to said first source of supply voltage.

* * * * *